(12) United States Patent  
Misaki (10) Patent No.: US 12,550,755 B2
(45) Date of Patent: Feb. 10, 2026

(54) HOLLOW PACKAGE (71) Applicant: Mitsubishi Electric Corporation, Tokyo (JP)

(72) Inventor: Koji Misaki, Tokyo (JP)

(73) Assignee: Mitsubishi Electric Corporation, Tokyo (JP)

(*) Notice: Subject to any disclaimer, the term of this patent is extended or adjusted under 35 U.S.C. 154(b) by 0 days.

(21) Appl. No.: 18/718,192

(22) PCT Filed: Apr. 11, 2022

(86) PCT No.: PCT/JP2022/017500
§ 371 (c)(1),
(2) Date: Jun. 10, 2024

(87) PCT Pub. No.: WO2023/199375
PCT Pub. Date: Oct. 19, 2023

(65) Prior Publication Data
US 2025/0046746 A1 Feb. 6, 2025

(51) Int. Cl.
*H01L 21/673* (2006.01)
*H01L 23/00* (2006.01)
*H01L 23/12* (2006.01)

(52) U.S. Cl.
CPC ............. *H01L 24/29* (2013.01); *H01L 23/12* (2013.01); *H01L 24/32* (2013.01);
(Continued)

(58) Field of Classification Search
CPC ......... H01L 24/29; H01L 24/32; H01L 23/12; H01L 2224/29011; H01L 21/67359; H01L 21/67353; H01L 21/67386
(Continued)

(56) References Cited

U.S. PATENT DOCUMENTS 10,314,171 B1 6/2019 Aleksov et al.
2008/0217752 A1 9/2008 Hata et al.
(Continued)

FOREIGN PATENT DOCUMENTS

JP 2004-146392 A 5/2004
JP 2008-192700 A 8/2008
(Continued)

OTHER PUBLICATIONS

International Search Report issued in PCT/JP2022/017500; mailed Jun. 21, 2022.
(Continued)

*Primary Examiner* — Steven A. Reynolds
(74) *Attorney, Agent, or Firm* — Studebaker Brackett PLLC (57) ABSTRACT

A hollow package includes a device substrate; a lid substrate provided above the device substrate; a first sealing ring provided on an upper surface of the device substrate; a second sealing ring provided on a lower surface of the lid substrate so as to face the first sealing ring; a seal layer that bonds the first sealing ring and the second sealing ring; and a functional element provided in a hollow portion surrounded by the device substrate, the lid substrate, the first sealing ring, the second sealing ring, and the seal layer, wherein the first sealing ring or the second sealing ring has a corner portion in a planar view, and the first sealing ring or the second sealing ring has a recess, which is recessed in a direction perpendicular to the upper surface of the device substrate, locally formed in a portion including the corner portion.

10 Claims, 8 Drawing Sheets

(52) U.S. Cl.
CPC .............. *H01L 2224/29011* (2013.01); *H01L 2224/29035* (2013.01); *H01L 2224/29155* (2013.01); *H01L 2224/32221* (2013.01)

(58) Field of Classification Search
USPC ............................ 206/710, 454; 257/21.499
See application file for complete search history.

(56) References Cited

U.S. PATENT DOCUMENTS

| | | | | |
|---|---|---|---|---|
| 2010/0176467 | A1* | 7/2010 | Fukasawa | B81C 1/00269 |
| | | | | 257/416 |
| 2013/0248399 | A1* | 9/2013 | Lin | B65D 45/16 |
| | | | | 206/454 |
| 2019/0267943 | A1* | 8/2019 | Obata | H01L 23/20 |
| 2020/0331749 | A1 | 10/2020 | Dong et al. | |
| 2020/0335371 | A1* | 10/2020 | Chuang | H01L 21/67376 |
| 2021/0276859 | A1* | 9/2021 | Ishii | B81B 7/0038 |

FOREIGN PATENT DOCUMENTS

| | | |
|---|---|---|
| JP | 2008-218811 A | 9/2008 |
| JP | 2010-161271 A | 7/2010 |
| JP | 2015-170685 A | 9/2015 |
| JP | 2016-531421 A | 10/2016 |
| JP | 2020-175500 A | 10/2020 |
| WO | 2015/006327 A1 | 1/2015 |

OTHER PUBLICATIONS

Office Action issued in JP 2022-547771; mailed by the Japanese Patent Office on Aug. 30, 2022.

* cited by examiner

HOLLOW PACKAGE

FIELD

The present disclosure relates to a hollow package.

BACKGROUND

PTL 1 discloses a package for housing a semiconductor device including a base and a lid. A placement part on which the semiconductor device is placed is provided on a main surface on the upper side of the base. An electrode pad is formed around the placement part. A frame is attached to a peripheral portion of the main surface on the upper side of the base to surround the placement part and the electrode pad. An upper surface of the frame has a plurality of holes formed substantially over its entire circumference to be directed downward. A plurality of protrusions to be respectively fitted into the plurality of holes are formed in a peripheral portion of a lower surface of the lid.

CITATION LIST

Patent Literature

[PTL 1] JP 2004-146392 A

SUMMARY

Technical Problem

In PTL 1, the lid and the frame are bonded with a solder. In such a structure, the solder tends to accumulate particularly in a corner portion of the frame. Accordingly, the solder provided in the corner portion of the frame may overflow into the frame and contact a wiring formed on the base.

An object of the present disclosure is to obtain a hollow package that can improve in reliability.

Solution to Problem

A hollow package according to the first disclosure includes a device substrate; a lid substrate provided above the device substrate; a first sealing ring provided on an upper surface of the device substrate; a second sealing ring provided on a lower surface of the lid substrate facing the device substrate so as to face the first sealing ring; a seal layer that bonds the first sealing ring and the second sealing ring; and a functional element provided in a hollow portion surrounded by the device substrate, the lid substrate, the first sealing ring, the second sealing ring, and the seal layer, wherein the first sealing ring or the second sealing ring has a corner portion in a planar view, and the first sealing ring or the second sealing ring has a recess, which is recessed in a direction perpendicular to the upper surface of the device substrate, locally formed in a portion including the corner portion.

A hollow package according to the second disclosure includes a device substrate; a lid substrate provided above the device substrate; a first sealing ring provided on an upper surface of the device substrate; a second sealing ring provided on a lower surface of the lid substrate facing the device substrate so as to face the first sealing ring; a seal layer that bonds the first sealing ring and the second sealing ring; and a functional element provided in a hollow portion surrounded by the device substrate, the lid substrate, the first sealing ring, the second sealing ring, and the seal layer, wherein the first sealing ring or the second sealing ring has a corner portion in a planar view, and the corner portion is wider than a portion, other than the corner portion, of the first sealing ring or the second sealing ring provided with the corner portion.

Advantageous Effects of Invention

In the hollow package according to the first disclosure, the recess is locally formed in the portion including the corner portion in the first sealing ring or the second sealing ring. Accordingly, a solder can be prevented from overflowing from the sealing ring particularly in the corner portion. Therefore, an improvement in reliability can be achieved.

In the hollow package according to the second disclosure, the corner portion of the sealing ring is wider than the portion other than the corner portion. Accordingly, a solder can be prevented from overflowing from the sealing ring particularly in the corner portion. Therefore, an improvement in reliability can be achieved.

DESCRIPTION OF EMBODIMENTS

A hollow package according to each embodiment are described with reference to drawings. Identical or corresponding constitutional elements are given the same refer-

Embodiment 1

Figure 1:
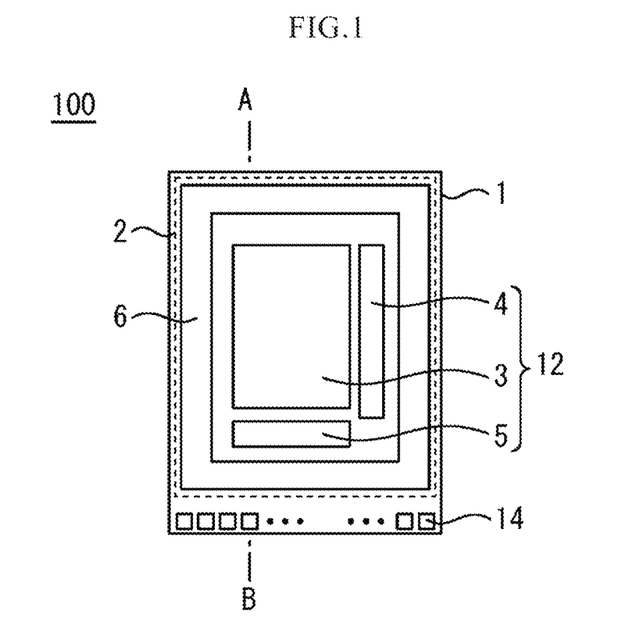
FIG. 1 is a plan view of a hollow package according to an embodiment 1.
Figure 2:
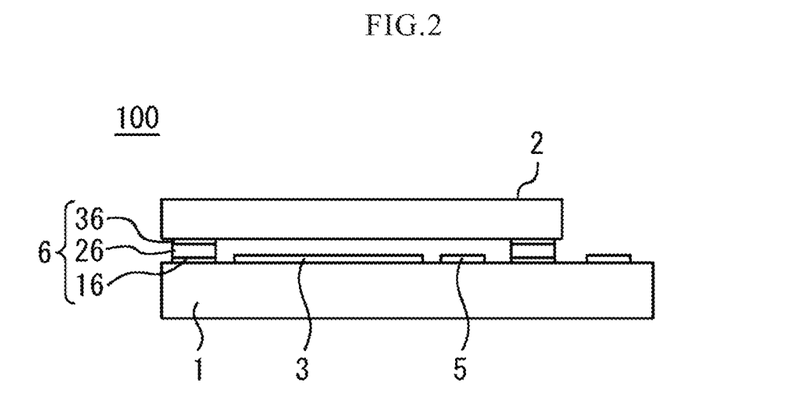
FIG. 2 is a cross-sectional view obtained by cutting FIG. 1 along a straight line A-B.

FIG. 1 is a plan view of a hollow package 100 according to an embodiment 1. FIG. 2 is a cross-sectional view obtained by cutting FIG. 1 along a straight line A-B. The hollow package 100 includes a device substrate 1 and a lid substrate 2 provided above the device substrate 1. In FIG. 1, a position of the lid substrate 2 is indicated by a broken line for convenience. A sealing ring 16 is provided on an upper surface of the device substrate 1. A sealing ring 36 is provided on a lower surface of the lid substrate 2 facing the device substrate 1 so as to face the sealing ring 16. A seal layer 26 bonds the sealing ring 16 and the sealing ring 36.

The sealing rings 16 and 36 are each formed of Ni, for example. The seal layer 26 is, for example, a solder. The sealing rings 16 and 36 and the seal layer 26 are collectively referred to as a seal 6. The device substrate 1 and the lid substrate 2 are bonded by the seal 6. The sealing rings 16 and 36 are respectively intermediate layers for bonding the device substrate 1 and the lid substrate 2 to the seal layer 26. The device substrate 1, the lid substrate 2, the sealing rings 16 and 36, and the seal layer 26 form a hollow element structure. The hollow package 100 is also referred to as a hermetic package. A hollow portion surrounded by the device substrate 1, the lid substrate 2, the sealing rings 16 and 36, and the seal layer 26 is provided with functional elements 3, 4, and 5.

Figure 3:
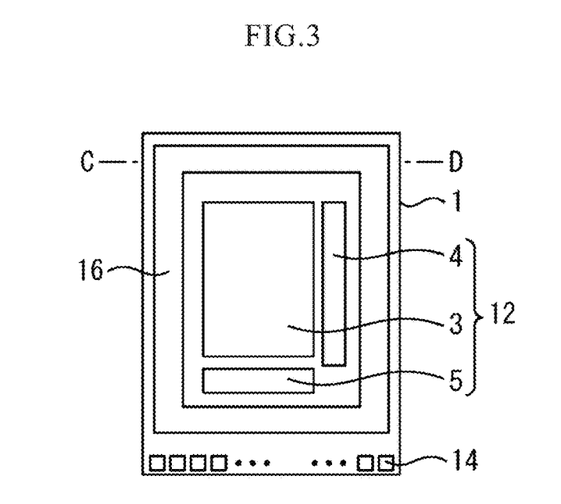
FIG. 3 is a plan view of the device substrate according to the embodiment 1.
Figure 4:
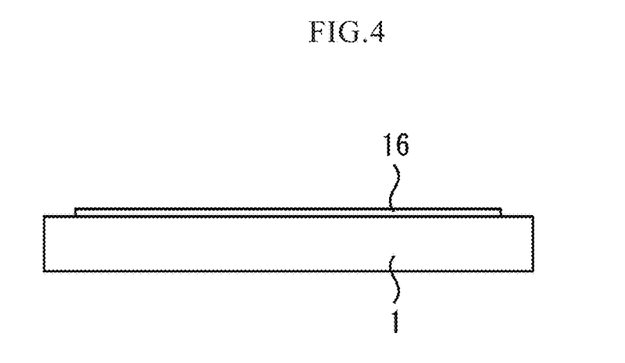
FIG. 4 is a cross-sectional view obtained by cutting FIG. 3 along a straight line C-D.

FIG. 3 is a plan view of the device substrate 1 according to the embodiment 1. FIG. 4 is a cross-sectional view obtained by cutting FIG. 3 along a straight line C-D. The functional elements 3, 4, and 5 are collectively referred to as a device 12. The device 12 is arranged inside the sealing ring 16 on the upper surface of the device substrate 1. The device 12 includes MEMS (Micro Electro Mechanical Systems) and a semiconductor device, for example. A plurality of bonding pads 14 are arranged outside the sealing ring 16. The bonding pads 14 are each electrically connected to a wiring board not illustrated, for example. An upper surface of the sealing ring 16 has no depression formed therein, and is flat.

Figure 5:
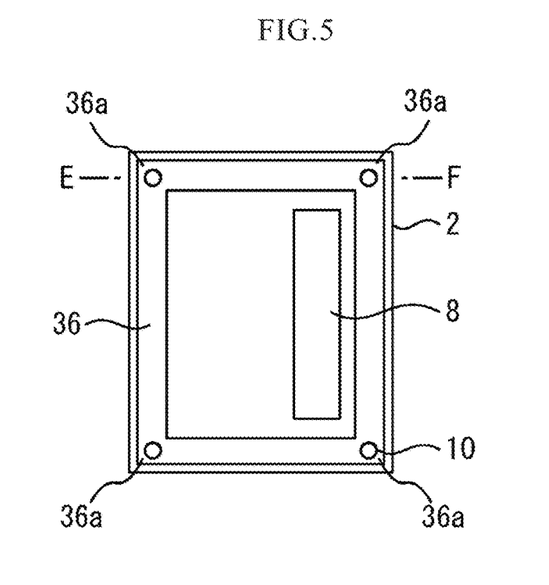
FIG. 5 is a bottom view of the lid substrate according to the embodiment 1.
Figure 6:
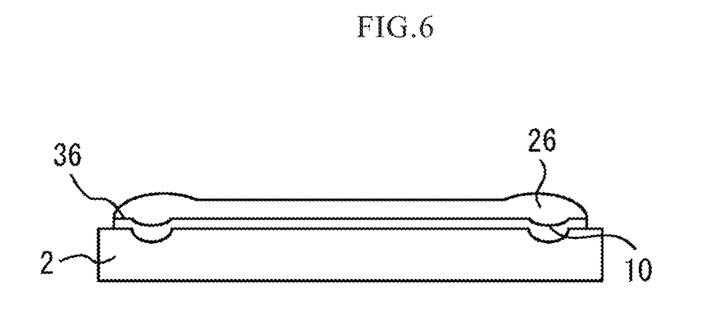
FIG. 6 is a cross-sectional view obtained by cutting FIG. 5 along a straight line E-F.

FIG. 5 is a bottom view of the lid substrate 2 according to the embodiment 1. FIG. 6 is a cross-sectional view obtained by cutting FIG. 5 along a straight line E-F. FIG. 6 also illustrates the seal layer 26. The sealing ring 36 has corner portions 36a in a planar view. Recesses 10, which are recessed in a direction perpendicular to the upper surface of the device substrate 1, are respectively formed in the corner portions 36a of the sealing ring 36. The recesses 10 are respectively formed in the corner portions 36a, for example.

A sorbent 8 for adsorbing gas may be formed in a portion, which is surrounded by the sealing ring 36, of the lid substrate 2. The sorbent 8 is also referred to as a getter. To increase a hollow volume, a depression may be formed in the lower surface of the lid substrate 2.

The hollow package 100 forms a micro electro mechanical system (MEMS) device, for example. In the MEMS device, a sensor, an actuator, and the like are integrated by a microprocessing technique on the device substrate. The device substrate 1 according to the present embodiment is, for example, an Si substrate. The device substrate 1 may be a compound semiconductor substrate made of GaAs, InP, GaN, SiC, or the like.

Examples of the MEMS device include an infrared sensor, a gyro sensor, and an acceleration sensor. An uncooled infrared sensor among infrared sensors, for example, is also referred to as a thermal-type sensor. The uncooled infrared sensor converts incident infrared rays into heat. The uncooled infrared sensor reads out a change in temperature of an object as a change of an electrical signal. Such an infrared sensor has a heat-insulated structure in which a sensor as an imaging element is thermally insulated from a base material to enhance the detection sensitivity of infrared rays. To enhance a heat insulating property, the infrared sensor is generally arranged under a vacuum environment. That is, the infrared sensor is arranged in a sealed vacuum space. The hollow package 100 in the present embodiment is, for example, a vacuum package including such a sensor.

Generally, the higher the infrared transmittance of a member as a lid of a vacuum package is, the higher the detection sensitivity of infrared rays is. Accordingly, silicon or ZnS containing low oxygen having a high transmittance may be used as the lid substrate 2. An antireflection film may be formed in the lid substrate 2.

Then, an effect of the present embodiment will be described. Generally, a solder tends to accumulate in a corner portion of a sealing ring. As a comparative example of the present embodiment, in a structure in which a surface of a sealing ring is flat, a solder is finished into a raised shape in a corner portion of the sealing ring. If such a solder pool is large, the solder may overflow into the sealing ring during bonding. As a result, a semiconductor circuit or a wiring arranged in the vicinity of the sealing ring on a device substrate may contact the solder. This causes a possibility that the circuit is short-circuited or the wiring is damaged and a possibility that a malfunction of the device occurs.

A hollow element structure may be formed not by bonding a device substrate and a lid substrate but using a housing. In this case, a manufacturing cost for packaging may increase. As a bonding material for bonding the device into the housing, a material having a higher melting point than that of a bonding material for forming the hollow element structure and hardly containing desorption gas needs to be selected. Therefore, a material cost may increase.

On the other hand, the recesses 10 are respectively formed in the corner portions 36a of the sealing ring 36 in the present embodiment. This enables a solder pool to be reduced. The solder is melted to flow onto the sealing ring by solder reflow processing. In the present embodiment, the recess 10 is formed in each of the corner portions 36a of the sealing ring 36, thereby making it possible to prevent the seal layer 26 from being raised after solder reflow processing in the corner portion 36a. This phenomenon is not limited to a case where the seal layer 26 is a solder. The foregoing makes it possible to prevent the solder from overflowing into the sealing ring when the device substrate 1 and the lid substrate 2 are bonded. Therefore, it is possible to achieve an improvement in reliability and an improvement in yield. A manufacturing cost can be more reduced than that when the housing is used for the hollow element structure.

In the present embodiment, the recess 10 is formed in only the corner portion 36a of the sealing ring 36, and the recess 10 is not formed in a straight-line portion of the sealing ring 36. Not only this, but the recess 10 shall be locally formed in a portion, including the corner portion 36a, of the sealing ring 36. That is, the recess 10 may be formed in the corner portion 36a of the sealing ring 36 and part of the straight-line portion thereof.

The recess 10 may be formed in not the sealing ring 36 but the sealing ring 16. In this case, a similar effect to that when the recess 10 is formed in the sealing ring 36 is obtained.

That is, the sealing ring 16 or the sealing ring 36 shall have a corner portion in a planar view and have a recess locally formed in a portion including the corner portion.

A shape in a planar view of the recess 10 is not limited to a circular shape, but may be an elliptical shape, a polygonal shape, or the like. A cross-sectional shape of the recess 10 is not limited to a U shape, but may be a V shape or a polygonal shape.

Figure 7:
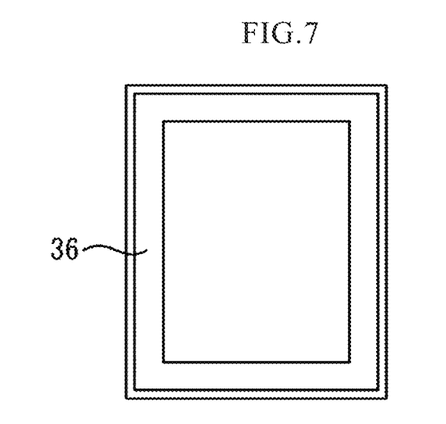
FIG. 7 is a diagram illustrating a shape of the sealing ring according to the embodiment 1.
Figure 8:
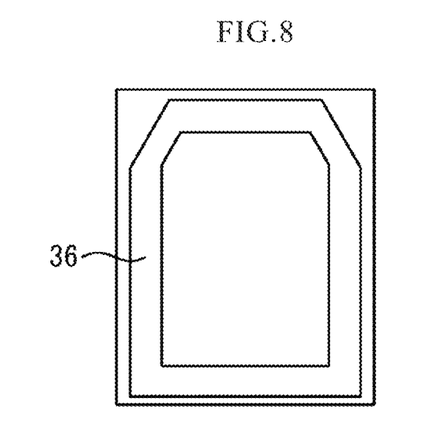
FIG. 8 is a diagram illustrating a shape of a sealing ring according to a modification to the embodiment 1.
Figure 9:
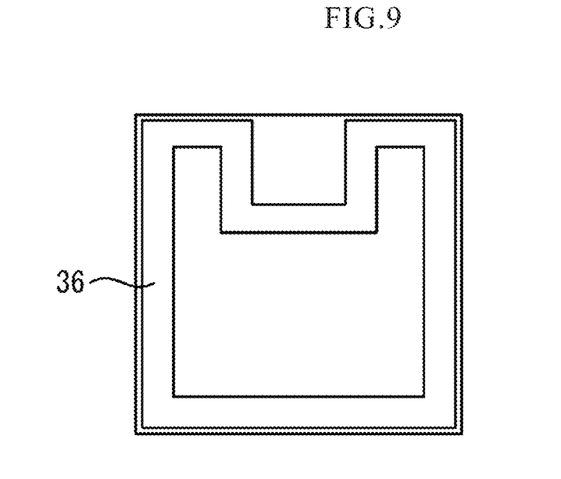
FIG. 9 is a diagram illustrating a shape of a sealing ring according to a modification to the embodiment 1.
Figure 10:
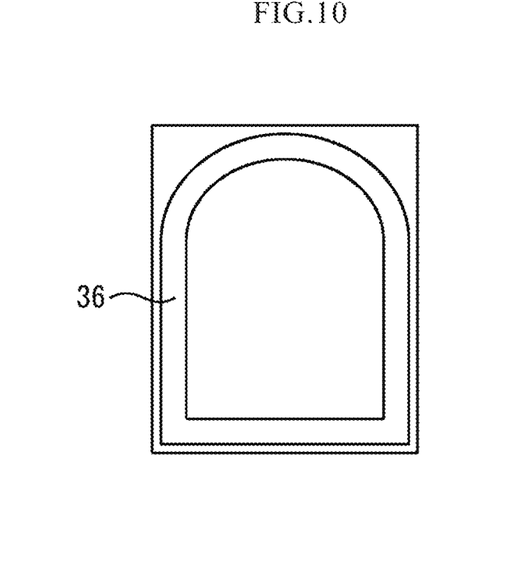
FIG. 10 is a diagram illustrating a shape of a sealing ring according to a modification to the embodiment 1.

FIG. 7 is a diagram illustrating a shape of the sealing ring according to the embodiment 1. FIGS. 8 to 10 are diagrams each illustrating a shape of a sealing ring according to a modification to the embodiment 1. Although the shape of the sealing ring 36 is illustrated in each of FIGS. 7 to 10, the same applies to a shape of the sealing ring 16. The sealing rings 16 and 36 in the present embodiment each have a rectangular shape or a square shape in a planar view, as illustrated in FIG. 7. Not only this, but the sealing rings 16 and 36 each have a polygonal shape such as a pentagonal shape in a planar view. As illustrated in FIG. 9, the sealing rings 16 and 36 may be each partially recessed in a planar view. As illustrated in FIG. 10, the sealing rings 16 and 36 may be each partially formed of a curve.

Then, a method for manufacturing the hollow package 100 will be described. The sealing rings 16 and 36 are each formed by electrolytic Ni plating, for example, and the seal layer 26 is formed of a lead-free solder, for example. As illustrated in FIG. 6, the recess 10 is formed by reflecting a shape of a recess formed in the lid substrate 2 on a surface of the sealing ring 36. That is, the lid substrate 2 has a recess locally formed in a portion including a corner portion. The recess of the lid substrate 2 can be formed using the existing photolithography technique and Si etching technique before electrolytic Ni plating formation. As a shape of the recess 10, any width and depth can be selected depending on a pattern size of a photomask.

As the width of each of the sealing rings 16 and 36, any width can be selected depending on the pattern size of the photomask using the existing photolithography technique. An amount of mounting of the solder on the sealing ring 36 is adjusted, whereby any thickness of the seal 6 can be obtained. The width of each of the sealing rings 16 and 36 and the thickness of the seal 6 are adjusted so that any hollow element structure can be obtained.

In the present embodiment, the sealing rings 16 and 36 are each formed of Ni, and the seal layer 26 is formed of a solder. The electrolytic Ni plating and the solder are alloyed during bonding. This enables the inside and the outside of the hollow element structure to be blocked by the seal 6. The inside of the hollow element structure is a vacuum atmosphere or an atmosphere of gas such as $N_2$ gas. When the inside and the outside of the hollow element structure are blocked, a hermetic package the internal atmosphere of which is maintained can be formed.

Each of the sealing rings 16 and 36 is not necessarily formed by electrolytic plating, but may be formed by electroless plating, a sputtering method, an MO-CVD (Metal Organic Chemical Vapor Deposition) method, or the like. The width of each of the sealing rings 16 and 36 is not necessarily selected by a photolithography method, but may be selected by a printing method, inkjet, a mask sputtering method, or the like. A material for the seal layer 26 is not limited to a lead-free solder, but any material can be selected. A high-temperature solder or AuSn is high in environmental load or cost. Accordingly, the lead-free solder is preferably selected.

These modifications can be applied, as appropriate, to hollow packages according to the following embodiments. Note that the hollow packages according to the following embodiments are similar to that of the first embodiment in many respects, and thus differences between the hollow packages according to the following embodiments and that of the first embodiment will be mainly described below.

Embodiment 2

Figure 11:
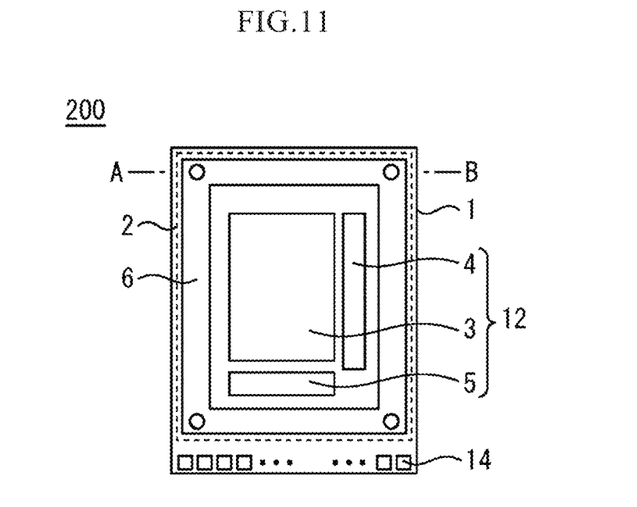
FIG. 11 is a plan view of a hollow package according to an embodiment 2.
Figure 12:
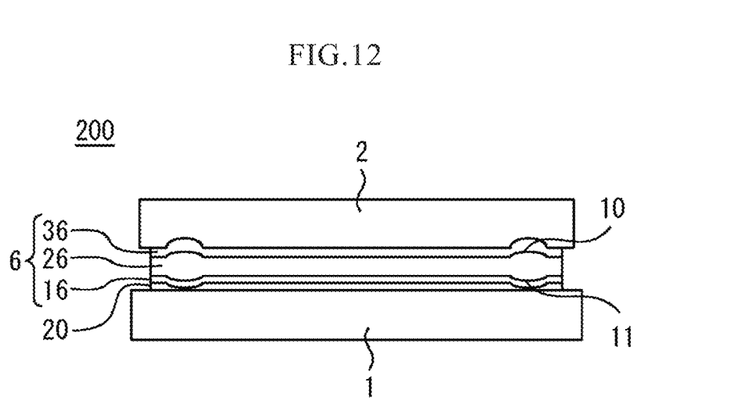
FIG. 12 is a cross-sectional view obtained by cutting FIG. 11 along a straight line A-B.
Figure 13:
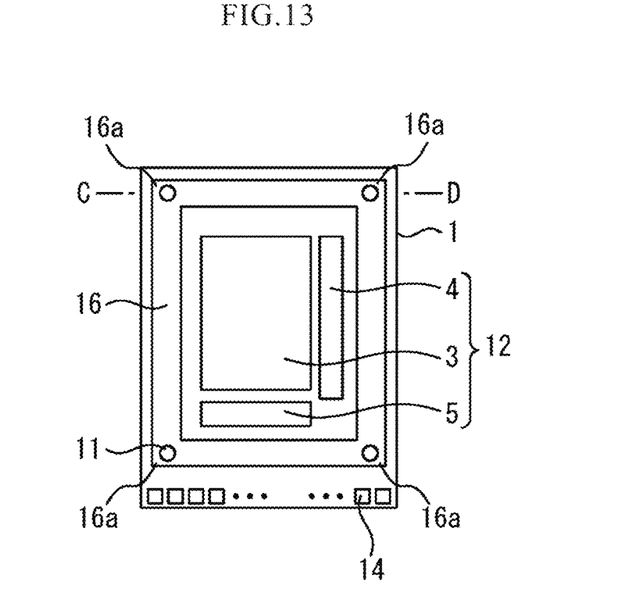
FIG. 13 is a plan view of a device substrate according to the embodiment 2.
Figure 14:
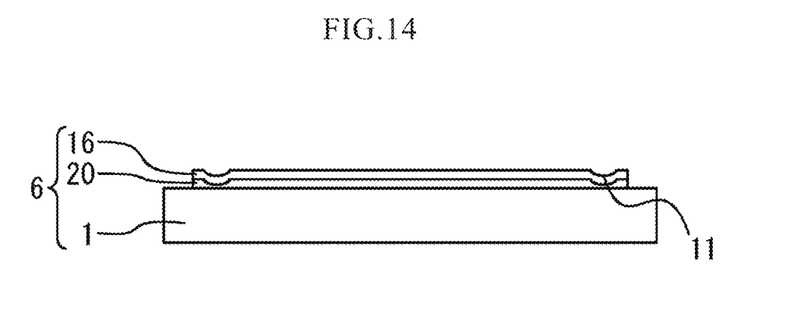
FIG. 14 is a cross-sectional view obtained by cutting FIG. 13 along a straight line C-D.

FIG. 11 is a plan view of a hollow package 200 according to an embodiment 2. FIG. 12 is a cross-sectional view obtained by cutting FIG. 11 along a straight line A-B. FIG. 13 is a plan view of a device substrate 1 according to the embodiment 2. FIG. 14 is a cross-sectional view obtained by cutting FIG. 13 along a straight line C-D. The embodiment 2 differs from the embodiment 1 in that recesses 10 and recesses 11 are respectively formed in both sealing rings 16 and 36.

The sealing ring 16 has corner portions 16a in a planar view. The recesses 11, which are recessed in a direction perpendicular to an upper surface of the device substrate 1, are respectively formed in the corner portions 16a of the sealing ring 16. A structure of a lid substrate 2 in the present embodiment is similar to the structure of the lid substrate 2 in the embodiment 1. The recesses 10 are respectively formed in corner portions 36a of the sealing ring 36, like in the embodiment 1.

In the present embodiment, a step is formed by an insulating film 20 or the like in a region, where the sealing ring 16 is formed, in the device substrate 1. The sealing ring 16 is formed on the insulating film 20. A recess is formed in a corner portion on an upper surface of the insulating film 20. The recess 11 is formed by reflecting a shape of the recess formed in the insulating film 20 on a surface of the sealing ring 16. That is, the recess is locally formed in a portion including the corner portion in the insulating film 20.

In the present embodiment, the recess 11 is also formed in each of the corner portions 16a of the sealing ring 16, whereby a solder mounted on the lid substrate 2 can be absorbed in the recess 11 during solder bonding. Therefore, the solder can be further prevented from overflowing into the device substrate 1.

A wiring or a device structure is not formed in the lid substrate 2 as a lid of the hollow package 200. Accordingly, a recess can be formed in the lid substrate 2 itself. On the other hand, the device substrate 1 includes a wiring and a device structure. Accordingly, a recess is formed in not the device substrate 1 but the insulating film 20 or the like, whereby the recess 11 may be formed in the sealing ring 16. The lid substrate 2 may be provided with a wiring or a device structure. In this case, a recess may be formed in not the substrate itself but an insulating film or the like, like in the device substrate 1.

The recess 10 shall be locally formed in a portion, including the corner portion 36a, of the sealing ring 36, and the recess 11 shall be locally formed in a portion, including the corner portion 16a, of the sealing ring 16, like in the embodiment 1.

A shape in a planar view of each of the recesses 10 and 11 is not limited to a circular shape, but may be an elliptical shape, a polygonal shape, or the like, like in the embodiment 1. A cross-sectional shape of each of the recesses 10 and 11 is not limited to a U shape, but may be a V shape or a polygonal shape. The modifications of the shape of the sealing ring and the method for manufacturing the hollow package 100 illustrated in the embodiment 1 can also be applied to the present embodiment.

Embodiment 3

Figure 15:
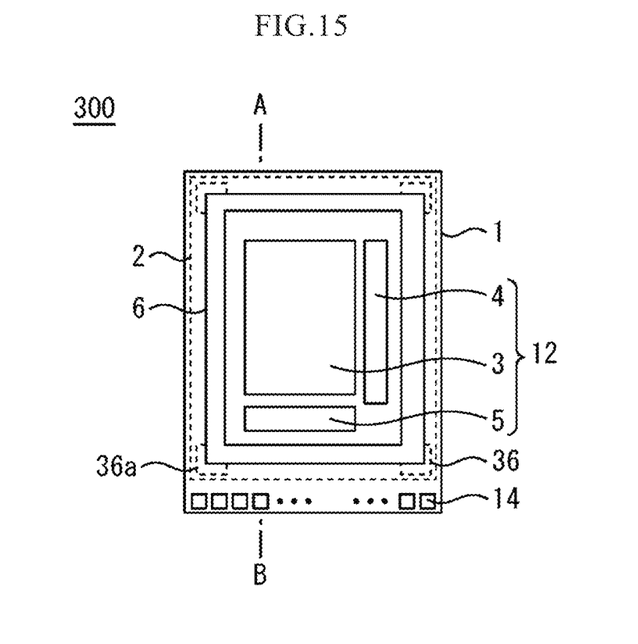
FIG. 15 is a plan view of a hollow package according to an embodiment 3.
Figure 16:
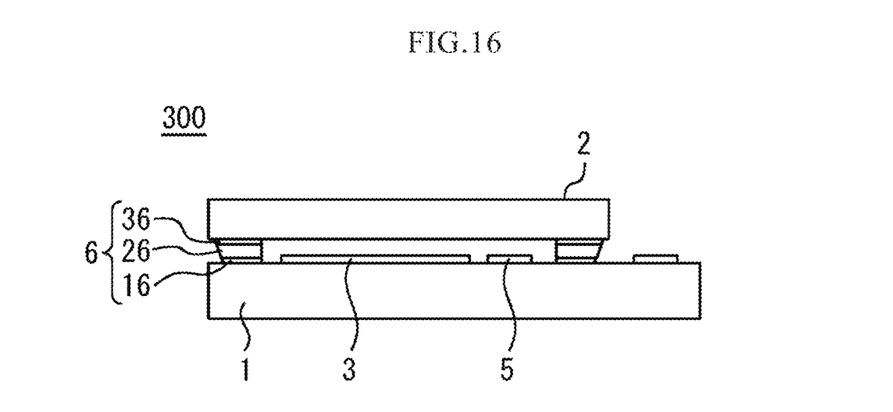
FIG. 16 is a cross-sectional view obtained by cutting FIG. 15 along a straight line A-B.
Figure 17:
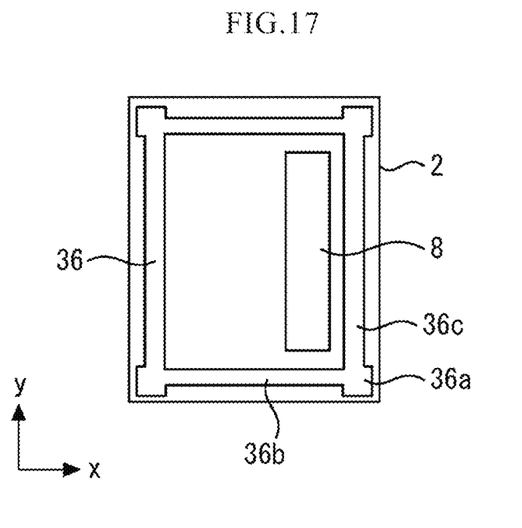
FIG. 17 is a bottom view of a lid substrate according to the embodiment 3.

FIG. 15 is a plan view of a hollow package 300 according to an embodiment 3. FIG. 16 is a cross-sectional view obtained by cutting FIG. 15 along a straight line A-B. The present embodiment differs from the embodiment 1 in a structure of a sealing ring 36. Other configurations are similar to those in the embodiment 1. FIG. 17 is a bottom view of a lid substrate 2 according to the embodiment 3. The sealing ring 36 has corner portions 36a in a planar view. Each of the corner portions 36a is wider than a portion, other than the corner portion 36a, of the sealing ring 36.

The sealing ring 36 includes a first portion 36b extending in a first direction and a second portion 36c extending in a second direction intersecting the first direction. In an example illustrated in FIG. 17, the first direction is an x-direction, and the second direction is a y-direction. The corner portion 36a is formed at an intersection of the first portion 36b and the second portion 36c. The corner portion 36a protrudes in the first direction and the second direction.

When the width of a bonding portion between a device substrate and a lid substrate is uniform, a solder tends to accumulate more in a corner portion than that in a straight-line portion of a sealing ring after solder reflow. In the present embodiment, a wide portion is formed in the corner portion 36a of the sealing ring 36. This makes it possible to prevent a solder from accumulating in the corner portion 36a after solder reflow. Accordingly, the solder can be prevented from overflowing into the sealing ring during bonding between the device substrate 1 and the lid substrate 2. Therefore, it is possible to achieve an improvement in reliability and an improvement in yield. Further, the solder can be caused to flow outward during bonding between the lid substrate 2 and the device substrate 1, like the seal layer 26 illustrated in FIG. 16. Therefore, the solder is further prevented from overflowing into the device substrate 1 so that a semiconductor circuit or a wiring can be prevented from contacting the solder.

Not the sealing ring 36 but a sealing ring 16 may be provided with a wide corner portion. Both the sealing rings 16 and 36 may be each provided with a wide corner portion. In this case, a similar effect to that in the present embodiment can also be obtained.

The corner portion 36a may protrude in only one of the first direction and the second direction. The corner portion 36a in the present embodiment has a square shape, but may have a circular shape, an elliptical shape, a polygonal shape, or the like. The modifications of the shape of the sealing ring illustrated in the embodiment 1 can also be applied to the present embodiment. For example, the wide corner portion in the present embodiment may be applied to a corner portion in which a first portion and a second portion of the sealing ring as illustrated in FIG. 8 do not perpendicularly intersect each other.

The method for manufacturing the hollow package 100 illustrated in the embodiment 1 is also applicable to the present embodiment. The sealing ring 16 or the sealing ring 36 may be formed of Ni, and the seal layer 26 may be formed of a solder.

Embodiment 4

Figure 18:
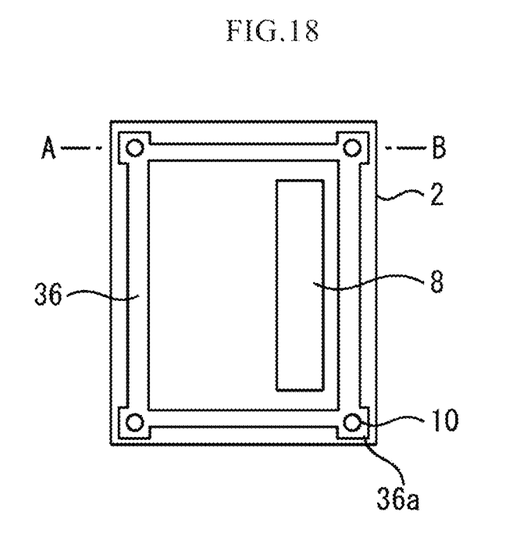
FIG. 18 is a bottom view of a lid substrate according to an embodiment 4.
Figure 19:
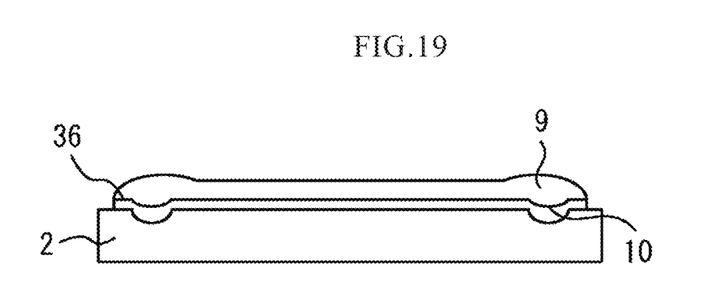
FIG. 19 is a cross-sectional view obtained by cutting FIG. 18 along a straight line A-B.

FIG. 18 is a bottom view of a lid substrate 2 according to an embodiment 4. FIG. 19 is a cross-sectional view obtained by cutting FIG. 18 along a straight line A-B. In the present embodiment, corner portions 36a of a sealing ring 36 respectively have recesses 10 formed therein, and each of the corner portions 36a is wider than a portion other than the corner portion 36a. In the present embodiment, a solder can be further prevented from accumulating in the corner portion 36a after solder reflow processing due to effects respectively described in the embodiment 1 and the embodiment 3.

In the hollow package 200 according to the embodiment 2, the corner portion 36a of the sealing ring 36 may be formed to be wider than a portion other than the corner portion 36a. In the hollow package 200 according to the embodiment 2, the corner portions 16a and 36a of the sealing rings 16 and 36 may be respectively formed to be wider than portions other than the corner portions. Respective features of the corner portions 16a and 36a described in the embodiments 1 to 3 can be optionally combined with one another. For example, the sealing ring 16 may be provided with the recess 11, and the sealing ring 36 may be provided with the wide corner portion 36a.

Technical features described in the embodiments may be used in appropriate combination.

REFERENCE SIGNS LIST 1 device substrate, 2 lid substrate, 3, 4, 5 functional element, 6 seal, 8 sorbent, 10, 11 recess, 12 device, 14 bonding pad, 16 sealing ring, 16a corner portion, 20 insulating film, 26 seal layer, 36 sealing ring, 36a corner portion, 36b first portion, 36c second portion, 100, 200, 300 hollow package

The invention claimed is:

1. A hollow package comprising:
a device substrate;
a lid substrate provided above the device substrate;
a first sealing ring provided on an upper surface of the device substrate;
a second sealing ring provided on a lower surface of the lid substrate facing the device substrate so as to face the first sealing ring;
a seal layer that bonds the first sealing ring and the second sealing ring; and
a functional element provided in a hollow portion surrounded by the device substrate, the lid substrate, the first sealing ring, the second sealing ring, and the seal layer, wherein
the first sealing ring or the second sealing ring has a corner portion in a planar view,
the first sealing ring or the second sealing ring has a recess, which is recessed in a direction perpendicular to the upper surface of the device substrate, locally formed in a portion including the corner portion, and
the corner portion has only one recess.

2. The hollow package according to claim 1, wherein
the first sealing ring has a first corner portion in a planar view,
the first sealing ring has a first recess, which is recessed in a direction perpendicular to the upper surface of the device substrate, locally formed in a portion including the first corner portion,
the second sealing ring has a second corner portion in a planar view, and
the second sealing ring has a second recess, which is recessed in a direction perpendicular to the upper surface of the device substrate, locally formed in a portion including the second corner portion.

3. The hollow package according to claim 1, wherein the corner portion is wider than a portion, other than the corner portion, of the first sealing ring or the second sealing ring provided with the corner portion.

4. The hollow package according to claim 1, wherein the first sealing ring or the second sealing ring is formed of Ni, and the seal layer is formed of a solder.

5. The hollow package according to claim 2, wherein the corner portion is wider than a portion, other than the corner portion, of the first sealing ring or the second sealing ring provided with the corner portion.

6. The hollow package according to claim 2, wherein the first sealing ring or the second sealing ring is formed of Ni, and the seal layer is formed of a solder.

7. The hollow package according to claim 3, wherein the first sealing ring or the second sealing ring is formed of Ni, and the seal layer is formed of a solder.

8. The hollow package according to claim 5, wherein the first sealing ring or the second sealing ring is formed of Ni, and the seal layer is formed of a solder.

9. The hollow package according to claim 1, wherein the recess receives a portion of the seal layer.

10. The hollow package according to claim 1, wherein the only one recess is entirely present in the corner portion.

* * * * *